United States Patent [19]

Ozturk et al.

[11] Patent Number: 5,336,903
[45] Date of Patent: Aug. 9, 1994

[54] SELECTIVE DEPOSITION OF DOPED SILICON-GERMANIUM ALLOY ON SEMICONDUCTOR SUBSTRATE, AND RESULTING STRUCTURES

[75] Inventors: Mehmet C. Ozturk, Cary, N.C.; Douglas T. Grider, Pleasanton, Calif.; Mahesh K. Sanganeria, Raleigh, N.C.; Stanton P. Ashburn, Cary, N.C.; Jimmie J. Wortman, Chapel Hill, N.C.

[73] Assignee: North Carolina State University at Raleigh, Raleigh, N.C.

[21] Appl. No.: 69,030

[22] Filed: May 28, 1993

Related U.S. Application Data

[62] Division of Ser. No. 919,735, Jul. 27, 1992, Pat. No. 5,242,847.

[51] Int. Cl.$^5$ .............................................. H01L 23/48
[52] U.S. Cl. ........................................ 257/19; 257/65; 257/382; 257/742; 257/755
[58] Field of Search ............... 257/65, 66, 382, 383, 257/384, 377, 385, 388, 411, 412, 413, 410, 19, 754, 742, 743

[56] References Cited

U.S. PATENT DOCUMENTS

| 4,442,449 | 4/1984 | Lehrer et al. | 357/67 |
| 4,619,038 | 10/1986 | Pintchovski | 29/590 |
| 5,168,072 | 12/1992 | Moslehi | 437/41 |

FOREIGN PATENT DOCUMENTS

3-172421  7/1991  Japan .

OTHER PUBLICATIONS

Sangameria et al., "Rapid Thermal Chemical Vapor Deposition of in-situ Boron Doped Polycrystalline Si$_x$Ge$_{1-x}$," *Journal of Electronic Materials,* vol. 21, No. 1 pp. 61–64, Jan., 1992.
Ashburn et al., "Formation of Titanium and Cobalt Germanides on Si(100) Using Rapid Thermal Processing," *Journal of Electronic Materials,* vol. 21, No. 1, pp. 81–86, Jan., 1992.
Selective Low-Pressure Chemical Vapor Deposition of Si$_{1-x}$Ge$_x$ Alloys in a Rapid Thermal Processor Using Dichlorosilane and Germane, Y. Z. Mehmet et al., Appl. Phys. Lett. 57 (20), Nov., 1990, pp. 2092–2094.
Selective Ge Deposition on Si Using Thermal Decomposition of GeH$_4$, H. Ishii et al., Appl. Phys. Lett. 47 (8), Oct. 1985, pp. 863–865.
A Polycrystalline-Si$_{1-x}$Ge$_x$-Gate CMOS Technology, T. King et al., IEDM 90, pp. 253–256, 1990.
Rapid Thermal Chemical Vapor Deposition of Germanium on Silicon and Silicon Dioxide and New Applications on Ge in ULSI Technologies, M. C. Ozturk et al., Journal of Electronic Materials, vol. 19, No. 10, 1990, pp. 1129–1134.

(List continued on next page.)

*Primary Examiner*—William Mintel
*Attorney, Agent, or Firm*—Bell, Seltzer, Park & Gibson

[57] ABSTRACT

Doped silicon-germanium alloy is selectively deposited on a semiconductor substrate, and the semiconductor substrate is then heated to diffuse at least some of the dopant from the silicon-germanium alloy into the semiconductor substrate to form a doped region at the face of the semiconductor substrate. The doped silicon-germanium alloy acts as a diffusion source for the dopant, so that shallow doped, regions may be formed at the face of the semiconductor substrate without ion implantation. A high performance contact to the doped region is also provided by forming a metal layer on the doped silicon-germanium alloy layer and heating to react at least part of the silicon-germanium alloy layer with at least part of the metal layer to form a layer of germanosilicide alloy over the doped regions. The method of the present invention is particularly suitable for forming shallow source and drain regions for a field effect transistor, and self-aligned source and drain contacts therefor.

12 Claims, 7 Drawing Sheets

OTHER PUBLICATIONS

RTP-CVD: A Single Wafer In-Situ Multiprocessing Manufacturing Technology for ULSI, D. L. Kwong, SPIE vol. 1189 Rapid Isothermal Processing (1989), pp. 109–120.

Elevated Source/Drain MOSFET, S. S. Wong et al., IEDM 84, pp. 634–637, 1984.

UPMOS–A New Approach to Submicron VLSI, W. T. Lynch et al., Solid State Devices, Elsevier Science Publishers B.V. (North-Holland), 1988, pp. 25–28.

Self-Aligned Contact Schemes for Source-Drains in Submicron Devices, W. T. Lynch, IEDM 87, pp. 354–357, 1987.

High Performance Half-Micron PMOSFETs With 0.1UM Shallow P+N Junction Utilizing Selective Silicon Growth and Rapid Thermal Annealing, H. Shibata et al., IEDM 87, pp. 590–593, 1987.

New Submicron MOSFET Structural Concept for Supression of Hot Carriers, A. F. Tasch et al., Electronics Letters, Jan. 1990, vol. 26, No. 1, pp. 39–41.

SELECTIVE DEPOSITION OF DOPED SILICON-GERMANIUM ALLOY ON SEMICONDUCTOR SUBSTRATE, AND RESULTING STRUCTURES

This application is a divisional of application Ser. No. 07/919,735, filed Jul. 27, 1992, now U.S. Pat. No. 5,242,847.

FIELD OF THE INVENTION

This invention relates to a process for forming high density microelectronic devices such as field effect transistors, and the devices formed thereby.

BACKGROUND OF THE INVENTION

One of the continuing goals of the semiconductor industry is the production of smaller microelectronic devices and denser integrated circuits. In order to produce microelectronic devices having dimensions which are small enough to meet the requirements of Ultra Large Scale Integration (ULSI), both the lateral and vertical dimensions of the microelectronic devices in a semiconductor substrate must be reduced. In particular, as the device sizes shrink, there is a need to form shallow regions of a predetermined conductivity at the face of the semiconductor substrate. These shallow regions, currently less than about fifteen hundred Angstroms in depth, can be used to form p-n junctions with the semiconductor substrate or with other regions in the semiconductor substrate. For example, there is a need to form shallow source and drain regions of a Field Effect Transistor (FET).

Presently, shallow regions are formed at the face of a semiconductor substrate by ion implantation. As is well known to those having skill in the art, ion implantation is a process in which appropriate dopant atoms are ionized, accelerated and directed at the face of the semiconductor substrate, so that the accelerated ions bombard and become implanted in the semiconductor substrate. Ion implantation typically results in implantation of p-type or n-type dopants on the entire semiconductor substrate. However, by using masks defined by well known lithographic techniques, patterned regions of implanted ions may be formed in the semiconductor substrate. Silicon dioxide is typically used as a mask, although other well known masks can also be used.

For example, to form an FET, field oxide regions are typically formed at the face of the semiconductor substrate, surrounding a predetermined area on the face. A gate electrode is then formed on the predetermined area. Ion implantation is then used to implant p-type or n-type dopants on the exposed face of the substrate, between the field oxide and gate electrode, to form the source and drain regions.

Unfortunately, ion implantation damages the face of the substrate, due to displacement of the lattice atoms in the substrate by the accelerated ions. This damage is often referred to as "implant damage". In many cases, the degree of lattice displacement can be enough to completely destroy the monocrystalline nature of the semiconductor substrate face. Implant damage is particularly objectionable for shallow regions formed at the substrate face because a large portion of the shallow region may be damaged.

The damage caused by ion implantation can be reduced by subjecting the wafer to a high temperature (for example above 850° C.) anneal in a furnace for an extended period of time. Annealing causes recrystallization of the substrate. However, a high temperature extended time anneal cannot eliminate all implantation damage. Moreover, the high temperature anneal also causes further diffusion of the implanted ions within the substrate, and thereby precludes the formation of shallow junctions at the substrate face. Accordingly, the conventional process for forming a doped region, by ion implantation and a subsequent anneal, is incompatible with the formation of ultra shallow doped regions.

Another critical concern in forming smaller microelectronic devices is the formation of electrical contacts to the shallow doped regions thereof. For example, when small geometry source and drain regions are formed at the face of a semiconductor substrate, electrical contact to these regions must be established in order to produce a functional FET. Since the contact areas of these regions are very small, it is difficult to form low resistivity contacts to these regions. When an ohmic (non-rectifying) contact is formed between a metal and a semiconductor, it is important to obtain the smallest possible contact resistance. This resistance is a function of the contact area as well as the energy band structure of the metal deposited on the semiconductor substrate.

In order to effectively contact small regions, a self-aligned silicide process, often referred to as a "salicide" process, has been developed. As known to those having skill in the art, silicidation is the process of forming a metal-silicon compound for use as an electrical contact. The process is desirable because the resulting silicide typically has a lower resistivity than does silicon alone and can be self aligned to exposed regions of silicon. Silicidation is often carried out by depositing a metal such as titanium, cobalt or tungsten onto silicon, followed by either conventional furnace annealing or rapid thermal annealing to form the metal silicide.

The salicide process provides a silicide contact without requiring alignment of the contact to the underlying region. In the salicide process, a layer of silicide-forming metal is blanket-deposited over the semiconductor substrate. Upon annealing at about 600° C., the metal reacts with the underlying silicon but does not react with the underlying silicon dioxide mask or gate electrode wall. Accordingly, a metal-silicon compound is formed on the exposed face of the semiconductor substrate, but not on the wall of the gate electrode or on the field oxide. The unreacted metal may then be removed from the gate electrode wall and field oxide using conventional etching techniques. Typical etchants combine hydrogen peroxide with sulfuric acid or ammonium hydroxide. A final, relatively higher temperature anneal may then be performed at about 800° C. to lower the resistivity of the silicide. Electrical contacts, for example to the source and drain regions of a FET, are thereby formed without requiring a separate lithography step.

Unfortunately, the salicide process can also adversely impact the formation of shallow regions in the substrate. In particular, the salicide process causes a significant amount of silicon to be consumed at the substrate face. As described above, the metal silicide is formed from the chemical reaction between the deposited metal and the underlying silicon. This typically unavoidably results in consumption of the silicon at the substrate face. As an illustrative example, when a 10 nm layer of titanium is deposited and then annealed to form titanium silicide, approximately 25 nm of silicon will also be consumed. This means that a shallow 75 nm region will be totally consumed by a titanium layer 30 nm thick used to produce titanium silicide.

A potential solution to this problem has been to selectively deposit additional silicon (typically monocrystalline silicon) on the substrate face over the source and drain regions. The additional silicon forms a buffer or sacrificial layer between the substrate and the metal deposited to form the silicide. This process raises the source and drain junctions and results in what is sometimes referred to as an "elevated" or "raised" source and drain FET. Unfortunately, this process possesses other disadvantages. Selective deposition of silicon requires relatively high temperatures (typically greater than 800° C.) and may employ or produce hydrochloric acid (HCl) which in turn may damage the structure. Also, dopant diffusion often takes place at the temperature required to deposit the silicon layer, making the junction deeper.

Accordingly, Ultra Large Scale Integration requires a process for forming doped regions at the face of a semiconductor substrate, which eliminates the need for ion implantation and the resulting substrate damage. This process should preferably be compatible with a salicide process for contacting the doped regions, and preferably allows the salicide process to be implemented without adversely impacting the reduced geometry doped regions which are formed.

SUMMARY OF THE INVENTION

It is therefore an object of the present invention to provide a method of forming high density semiconductor devices, and the resulting devices.

It is another object of the present invention to provide a method for forming high density field effect transistors, and the resulting devices.

It is yet another object of the present invention to provide a method for forming shallow doped regions at the face of a semiconductor substrate, and the resulting regions.

It is another object of the present invention to provide a method for forming shallow doped regions at the face of a semiconductor substrate without requiring the use of ion implantation.

It is still another object of the invention to provide a self-aligned salicide process for electrically contacting shallow doped regions at the face of a semiconductor substrate, without adversely impacting the shallow junctions, and the resulting devices.

These and other objects are provided, according to the present invention, by forming a layer of silicon-germanium alloy on a defined area of a face of a semiconductor substrate, with the layer of silicon-germanium alloy being doped with a predetermined dopant. The semiconductor substrate is then heated to diffuse at least some of the predetermined dopant from the silicon-germanium alloy layer into the semiconductor substrate, to form a doped region at the face of the semiconductor substrate.

The layer of doped silicon-germanium alloy is selectively formed on defined areas of the face of the semiconductor substrate. The areas may be defined by forming an oxide or other masking layer on the face of the semiconductor substrate, having an aperture therein for exposing the defined area on the face of the semiconductor substrate. Silicon-germanium alloy may then be selectively deposited on the exposed area on the face of the semiconductor substrate, and not on the oxide layer surrounding the exposed area. The silicon-germanium alloy is preferably in situ doped; i.e. it is doped while it is being selectively deposited.

The present invention uses a doped silicon-germanium alloy layer as a diffusion source for dopants into the semiconductor substrate. The silicon-germanium alloy can be selectively deposited at low temperatures on the exposed area of the face of the semiconductor substrate, and not on the mask. Moreover, the silicon-germanium alloy has a high melting point compared to pure germanium (melting point of 937° C.), so that the layer is not destroyed during a subsequent anneal. By providing a diffusion source for the regions, ion implantation need not be used and shallow doped regions may be formed. Doped regions of less than 1500 Angsttoms in depth may be preferably formed.

The method of the present invention is also particularly suitable for use with a salicide process. In particular, a conductor layer is formed on the doped silicon-germanium alloy, and the substrate is heated to react at least part of the silicon-germanium alloy with at least part of the conductor layer, and form a layer of metal/-silicon/germanium alloy, also referred to herein as "germanosilicide alloy", over the exposed area of the semiconductor substrate. A single heating step may be used to simultaneously diffuse at least some of the predetermined dopant in the germanium-silicon alloy into the semiconductor substrate to form the doped regions, and to also form the germanosilicide contact. Alternatively, the doped silicon-germanium layer is selectively deposited and the substrate is heated a first time to diffuse dopant and form the shallow region. Then, the metal layer is formed and the substrate is heated a second time to form the germanosilicide contact.

Accordingly, the doped silicon-germanium alloy layer can be used to provide a sacrificial layer during the salicide process in addition to providing the diffusion source for forming a shallow junction. One or more rapid thermal processing steps may be used to diffuse the dopant into the substrate from the doped silicon-germanium alloy and to convert the silicon-germanium alloy layer into germanosilicide alloy for high performance contacts.

The present invention may be used to form high density field effect transistors. In particular, a field oxide region is formed on a face of a semiconductor substrate, surrounding an area of the face. A gate electrode is formed on the predetermined area, with the gate electrode having a top and a side wall, and an oxide coating on the side wall. A layer of silicon-germanium alloy, doped with a predetermined dopant, is then selectively deposited on the area of the face, with the field oxide and the oxide coating being free of the doped silicon-germanium alloy layer. The substrate is heated to diffuse at least some of the predetermined dopant from the silicon-germanium alloy into the substrate and thereby form source and drain regions in the semiconductor substrate.

A layer of metal is then deposited on the semiconductor substrate, and in particular on the layer of silicon-germanium alloy, on the field oxide and on the gate electrode side wall. The substrate is heated again to react at least part of the silicon-germanium alloy with at least part of the metal thereover to form a high performance germanosilicide layer over the source and drain regions. If desirable, the doped germanosilicide layer may also be formed on the top of the gate electrode so that a high performance gate contact is also formed.

Shallow source and drain regions and high performance electrical contacts are thereby formed.

The semiconductor structure of the present invention includes a layer of silicon-germanium alloy on the face of a semiconductor substrate. The layer of silicon-germanium alloy is doped with a dopant of predetermined conductivity type. The semiconductor substrate is also doped with the dopant of predetermined conductivity type at the face thereof, beneath the layer of silicon-germanium alloy. The silicon germanium alloy may be partly or completely a germanosilicide alloy, and the doped regions are preferably source and drain regions of a field effect transistor.

DETAILED DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1A:
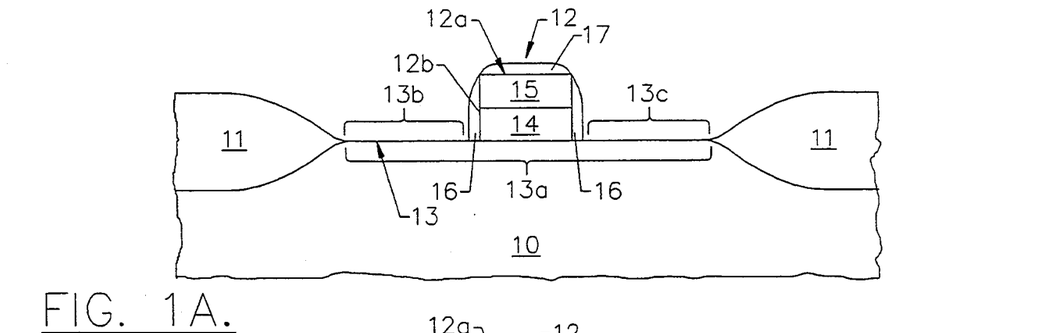
FIG. 1A illustrates a cross-sectional view of a conventional integrated circuit structure in a semiconductor substrate.

Referring now to FIGS. 1A–1F, a first embodiment of the present invention will be described. FIG. 1A illustrates a conventional integrated circuit structure, used for example to form Metal Oxide Semiconductor Field Effect Transistors (MOSFET) in a semiconductor substrate 10. Field oxide regions 11 are formed in semiconductor substrate 10 at face 13 to thereby define an area 13a at face 13. An electrode 12, typically a gate electrode, is also formed on the defined area 13a of face 13. Electrode 12 includes a top 12a and a side wall 12b. The electrode structure includes a gate oxide 14 and a gate conductor 15, typically polycrystalline silicon (polysilicon). An oxide coating 16 is formed on side wall 12b and an oxide coating 17 is formed on top 12a.

The electrode 12 may be formed using a conventional MOSFET fabrication process, for example by defining gate oxide 14 and gate conductor 15 using conventional photolithographic techniques and forming the oxide side wall 16 and oxide top 17 using a conventional chemical vapor deposition (CVD) process and a reactive ion etch (RIE) or other directional etch back process. Typically, the gate oxide is silicon dioxide about 40–100Å thick, gate electrode 15 is polysilicon about 2000–4000Å thick, and side wall coating 16 is silicon dioxide about 500–2000Å thick. Oxide layer 17 on top 12a may be as thin as about 50Å. An optional silicon nitride or other buffer layer (not shown) may be formed between oxide layer 17 and polysilicon gate conductor layer 15. The gate 12 and field oxide 11 define a pair of exposed areas 13b and 13c on face 13 within region 13a. Other conventional processes for forming field oxide 11 and gate electrode 12 may be used.

Figures 1B, 1C, 1D:
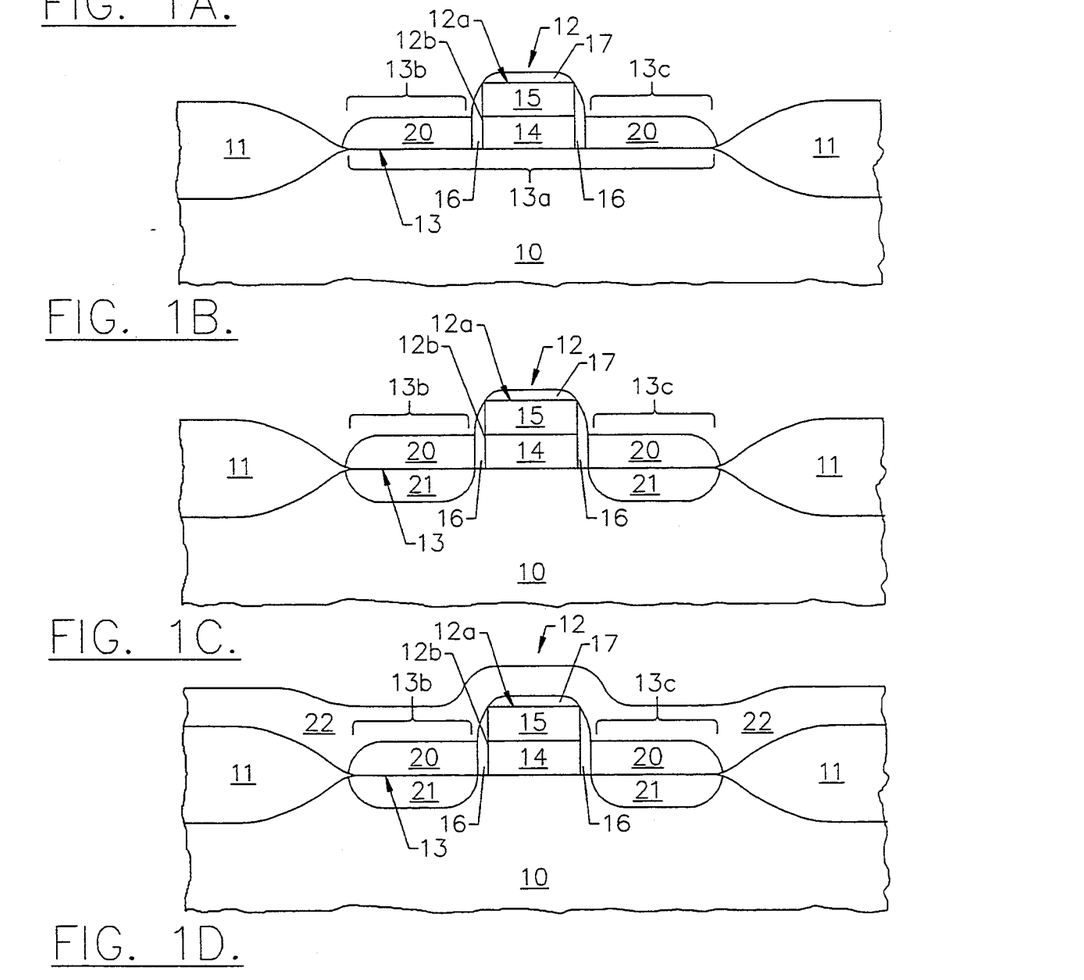

Referring now to FIG. 1B, a layer 20 of silicon-germanium alloy is selectively deposited on the exposed areas 13b, 13c at the face 13 of substrate 10. The silicon-germanium alloy layer 20 is doped with a dopant to provide the desired conductivity type. For example, the layer 20 is doped with boron, to provide p-type conductivity, or doped with arsenic, phosphorous or antimony to provide n-type conductivity.

As shown in FIG. 1B, layer 20 is selectively deposited on face 13 of substrate 10 so that field oxide 11 and gate 12 are free of silicon-germanium layer 20. Silicon-germanium alloy layer 20 may be selectively deposited on substrate 10 at low temperatures as described in a publication by Zhong, coinventor Öztürk, coinventor Grider, Wortman and Littlejohn entitled Selective *Low-Pressure Chemical Vapor Deposition of $Si_{1-x}Ge_x$ Alloys in a Rapid Thermal Processor Using Dichlorosilane and Germane*, Applied Physics Letters, Vol. 57, No. 20, Nov. 12, 1990, pp. 2092–2094, the disclosure of which is hereby incorporated herein by reference. As described in this publication, silicon-germanium alloy is deposited using the reactive gases $GeH_4$ and $SiH_2Cl_2$ in a hydrogen carrier gas. The deposition may be performed at a total pressure of 2.5 Torr and at temperatures between 500–800° C. using $GeH_4$:$SiH_2Cl_2$ ratios ranging from 0.025 to 1.00. The results show that silicon-germanium alloys can be deposited selectively on silicon with respect to silicon dioxide. The selectivity is enhanced significantly by the addition of $GeH_4$ in the gas stream. Silane ($SiH_4$) may also be used instead of dichlorosilane ($SiH_2Cl_2$). The deposition may take place in a rapid thermal processor designed to operate at reduced pressures.

The silicon-germanium alloy provides advantages which are not provided by silicon or germanium alone. In particular, the addition of silicon to the alloy produces a higher melting point than would be produced by germanium alone. On the other hand, the addition of germanium provides a higher growth rate and better selectivity than would be provided by silicon alone at low temperatures. In particular, silicon-germanium alloy can be deposited selectively at 600° C. At this temperature, dopant diffusion does not occur in silicon. Accordingly, the use of silicon-germanium alloy produces a high growth rate and better selectivity while producing a high melting point alloy. In an embodiment of the present invention, a $GeH_4$:$SiH_2Cl_2$ flow ratio of 1:5 is used to produce an alloy of 30% germanium and 70% silicon by heating in a rapid thermal processing system at 650° C. A heating time of 60 seconds may be used for each 300Å thickness of silicon-germanium alloy to be deposited. It will be understood by those having skill in the art that the thickness of the silicon-germanium alloy deposited is preferably selected as a function of the thickness of the germanosalicide region which is to be formed later. Typical thicknesses are between about 300Å to about 1000Å.

As already described, the silicon-germanium alloy layer 20 is doped with dopants of the desired conductivity. Doping of the silicon-germanium alloy layer 20 may be accomplished by ion implantation of the selected dopant into layer 20 after its formation. However, preferably in situ doping of silicon-germanium alloy layer is performed. In other words, the layer is doped as it is deposited. A preferred process for in situ doping of silicon-germanium alloy with boron is described in a publication entitled *Rapid Thermal Chemical Vapor Deposition of In-Situ Boron Doped Polycrystalline $Si_xGe_{1-x}$* by coinventor Sanganeria, coinventor Grider, coinventor Öztürk and Wortman published in the Journal of Electronic Materials, Vol. 21, No. 1, pp. 61–64, 1992, the disclosure of which is hereby incorporated herein by reference.

Boron in situ doped $Si_{0.7}Ge_{0.3}$ alloys may be deposited by rapid thermal chemical vapor deposition using the reactive gases $SiH_2Cl_2$, $GeH_4$ and $B_2H_6$ in an $H_2$ carrier gas. The $B_2H_6$ produces negligble effect on the deposition rate, but provides high dopant levels and low resistivity. $GeH_4$ and $B_2H_6$ may be premixed with hydrogen to a dilution of 7.8% and 40 ppm respectively. The $SiH_2Cl_2$ flow rate may be maintained in the range of 10–12.5 sccm, while the flow rate of $GeH_4$ is kept constant at 5 sccm to obtain 30% germanium. A doping concentration of $10^{20}$–$10^{21}$ boron atoms per cubic centimeter is obtained. Similar processes may be used to in situ dope with other dopants. For example, phosphine ($PH_3$) or arsine ($AsH_3$) can be used to incorporate n-type phosphorous or arsenic dopants.

Referring now to FIG. 1C, the substrate is then heated in a rapid thermal processor or in a conventional furnace to a temperature of about 750–900° C. to diffuse boron or other dopant from layer 20 into substrate 10 at face 13 to form shallow regions 21. The heating time and temperature in the annealing chamber may be controlled to form the desired diffusion depth. The heating time and/or temperature can be controlled to produce any desired depth of regions 21. Accordingly, shallow source and drain regions may be formed.

Figure 3A:
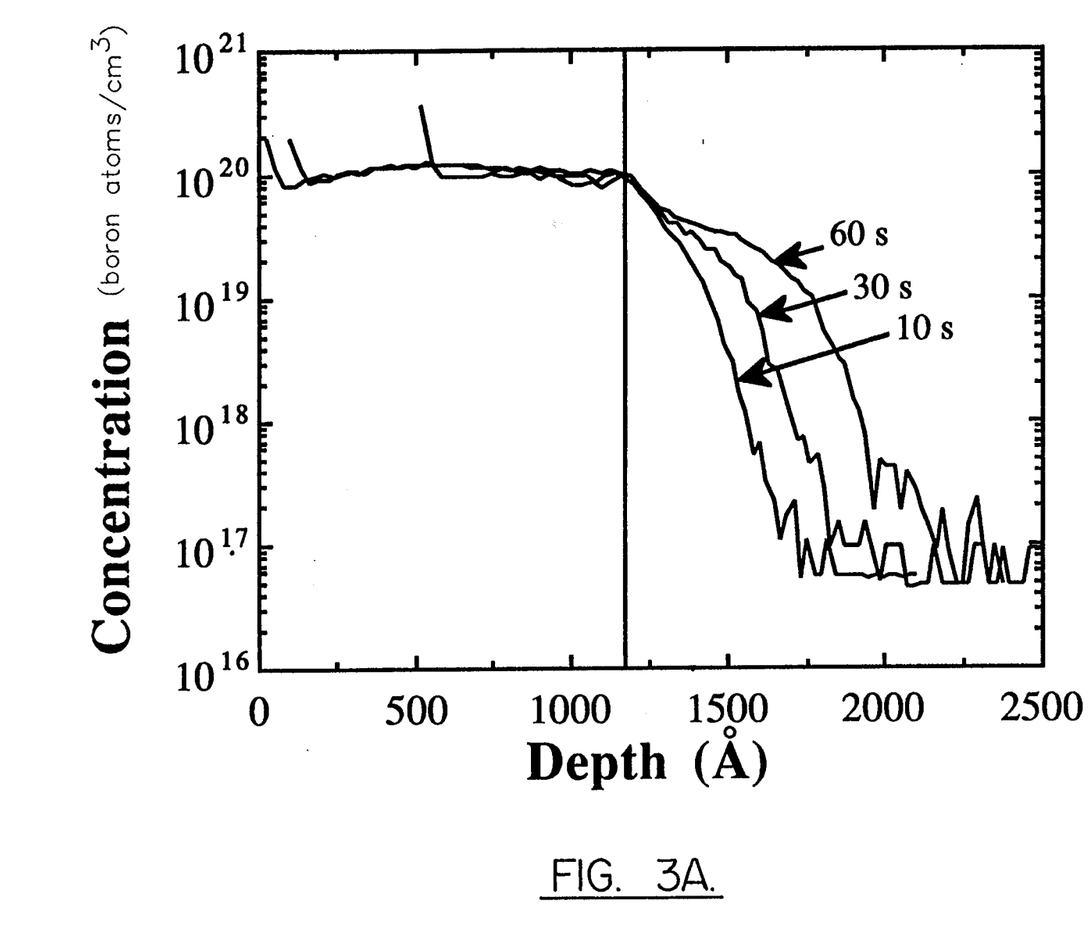
Figure 3B:
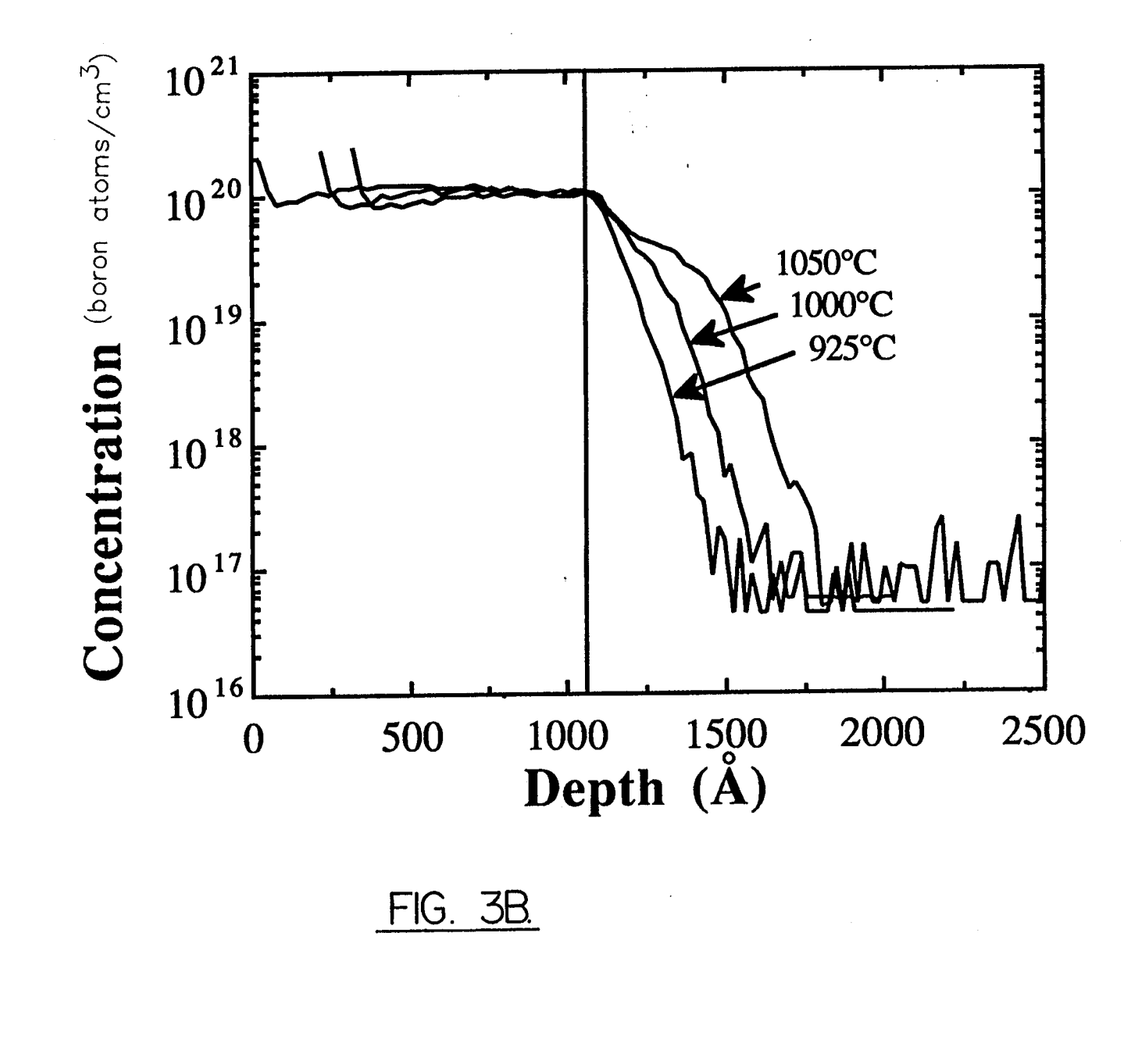
Figure 3C:
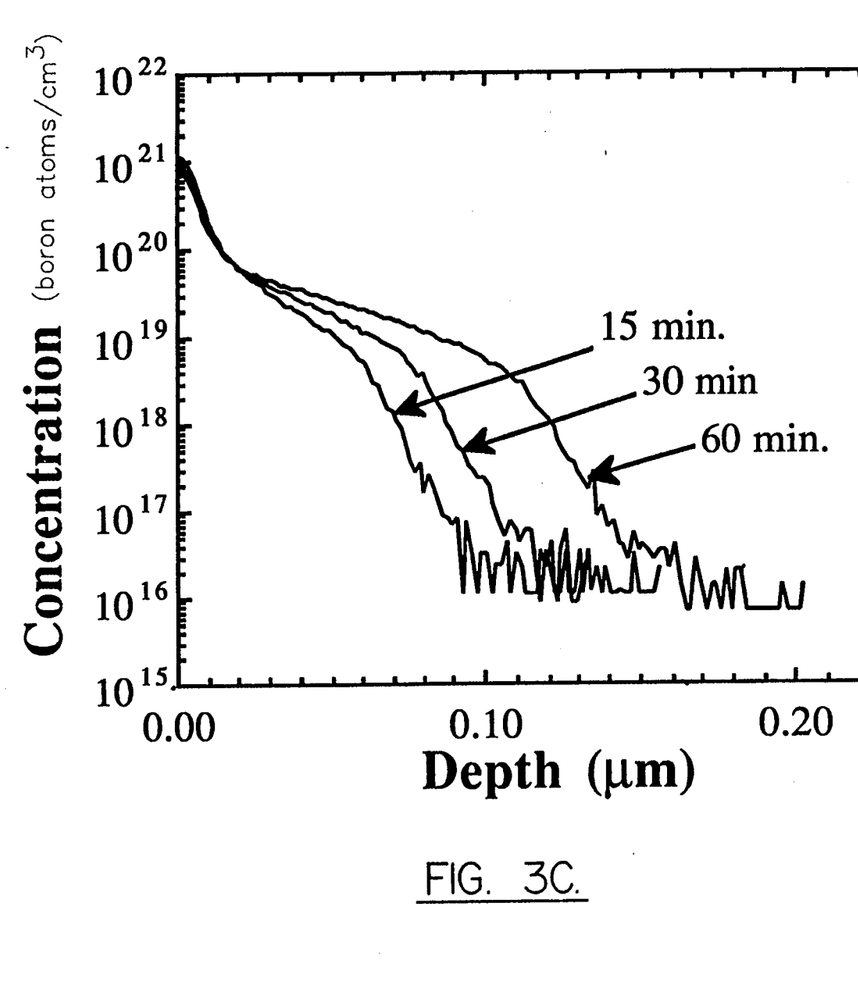

FIGS. 3A–3C illustrate the control of diffusion depth by varying diffusion time and temperature. FIGS. 3A–3C are graphical illustrations of boron concentration profiles in the silicon-germanium alloy layer and in regions 21 as measured by Secondary Ion Mass Spectroscopy (SIMS). FIG. 3A illustrates the boron concentration profiles after heating in a rapid thermal annealing furnace at 1000° C. for times of 10, 30 and 60 seconds. The substrate face is indicated by the vertical line at 1200Å. FIG. 3B illustrates boron concentration profiles after heating in a rapid thermal processing furnace for ten seconds at temperatures of 925° C., 1000° C. and 1050° C. Finally, FIG. 3C illustrates boron concentration profiles after heating in a conventional furnace at 850° C., for 15 minutes, 30 minutes and 60 minutes. In all cases, the junction depth may be defined at the location where boron concentration is less than about $10^{17}$ atoms per cubic centimeter.

Referring now to FIG. 1D, a metal layer 22 such as titanium, cobalt or alloys thereof is then blanket deposited on the entire face 13 of substrate 10. Layer 22 is preferably deposited to a thickness which will consume all of layer 20 in a subsequent salicide-germanicide reaction, but will not consume substantial portions of semiconductor substrate 10 at face 13. For example, it is known that titanium silicide consumes about 2.26Å of silicon and 2.56Å of germanium for every Angstrom of titanium.

Figure 1E:
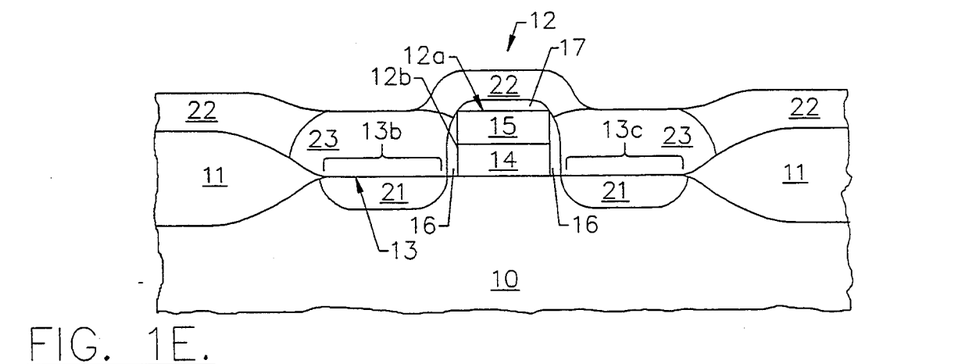
Figure 1F:
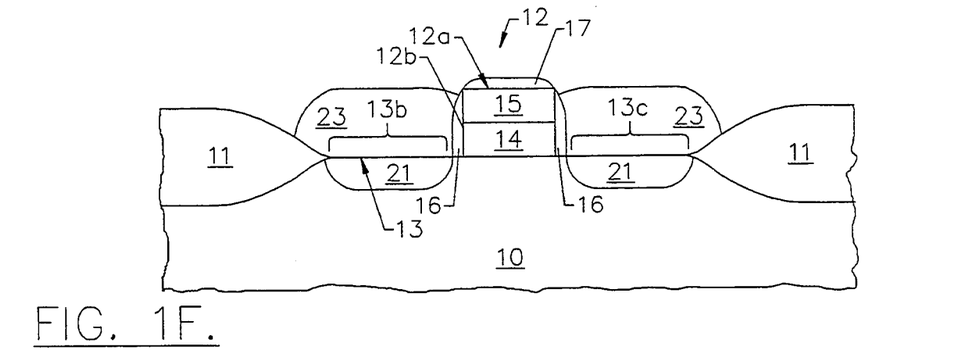

Then, as shown in FIG. 1E, the substrate is heated to an intermediate temperature to form titanium/silicon/-germanium alloy layer 23 from the silicon-germanium alloy layer 20 and the metal layer 22 above areas 13b and 13c on face 13 of substrate 10. Then, as shown in FIG. 1F, unreacted regions 22 may be removed using a standard etching technique. For example, the unreacted metal may be etched in a 1:1:5 ratio of $NH_3OH + H_2O_2 + H_2O$ at 20° C.

A higher temperature anneal may then take place to form stable, low resistivity germanosilicide. The formation of titanium and cobalt germanides in a rapid thermal processing furnace is described in a publication entitled *Formation of Titanium and Cobalt Germanides on Si(100) Using Rapid Thermal Processing* by coinventor Ashburn and coinventor Öztürk et al., published in the Journal of Electronic Materials, Vol. 21, No. 1, pp. 81–85, 1992, the disclosure of which is hereby incorporated herein by reference.

As described above, the thickness of layers 20 and 22 are preferably chosen so that they are entirely consumed in the formation of layer 23, without substantial consumption of substrate 10. As will be understood by those having skill in the art, the germanosilicide formation takes place very quickly, for example within 10 seconds at a temperature of about 850° C. in a rapid thermal processing system for a metal thickness of about 300Å. Accordingly, little or no additional diffusion of regions 21 takes place.

As shown in FIG. 1C, a semiconductor structure according to the invention includes a pair of laterally spaced apart regions 21 in semiconductor substrate 10 at face 13, with the laterally spaced apart regions 21 being doped with a predetermined dopant. An electrode 12 is included on face 13 between the pair of laterally spaced apart regions 21. A layer of silicon-germanium alloy 20 is on the face 13 over the pair of laterally spaced apart regions 21, with the layer of silicon-germanium alloy being doped with the same predetermined dopant. After the self-aligned silicidation process of FIG. 1F takes place, a layer of germanosilicide alloy 23 is included over the spaced apart regions 21. Accordingly, shallow source and drain regions may be formed for high density devices, without the need for substrate damaging ion implantation, and with self-aligned source and drain contacts. The process may be performed using rapid thermal processing, at a low thermal budget and high device throughput, so that low cost devices may be rapidly produced.

The process described in connection with FIGS. 1A–1F forms shallow source and drain regions and high performance contacts thereto. However, a germanosilicide contact to polysilicon gate conductor 15 is not formed. According to another embodiment of the present invention, a self-aligned germanosilicide contact for polysilicon gate conductor 15 is also formed. This embodiment is illustrated in FIGS. 2A–2F.

Figure 2A:
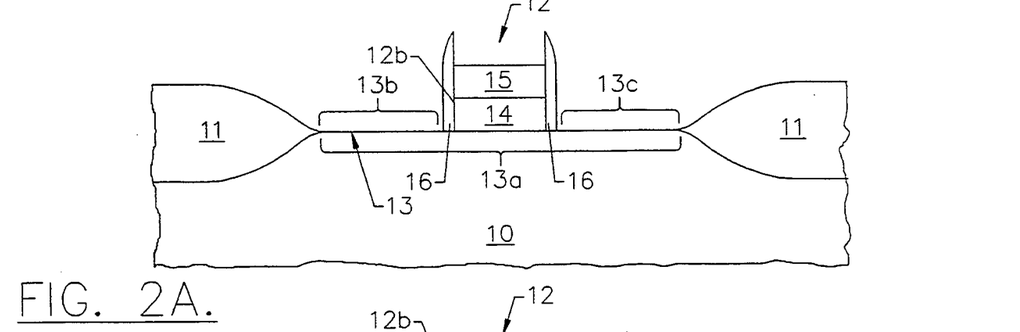
Figure 2B:
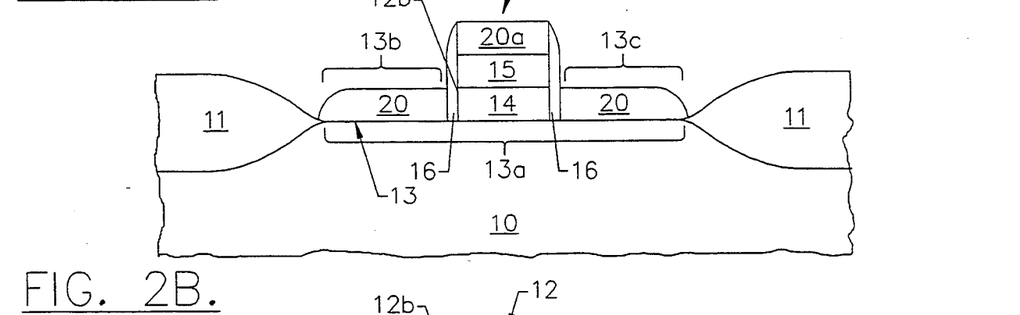

Referring now to FIG. 2A, processing begins as was already described in FIG. 1A, except that oxide layer 17 is not formed on the top 12a of gate electrode 12. This may be accomplished by forming gate oxide layer 14, polysilicon layer 15 and a layer of silicon nitride on polysilicon layer 15. The nitride/poly/oxide stack is then reactive ion etched to form gate-electrode 12. Sidewall 16 is then formed and the silicon nitride layer is selectively removed in hot phosphoric acid. Alternatively, oxide layer 17 may be formed on top 12a of gate electrode 12 and then removed. As shown in FIG. 2B, a layer of silicon-germanium alloy 20a is formed on polysilicon gate conductor 15 when layer 20 is formed on regions 13b and 13c.

Figures 2C, 2D:
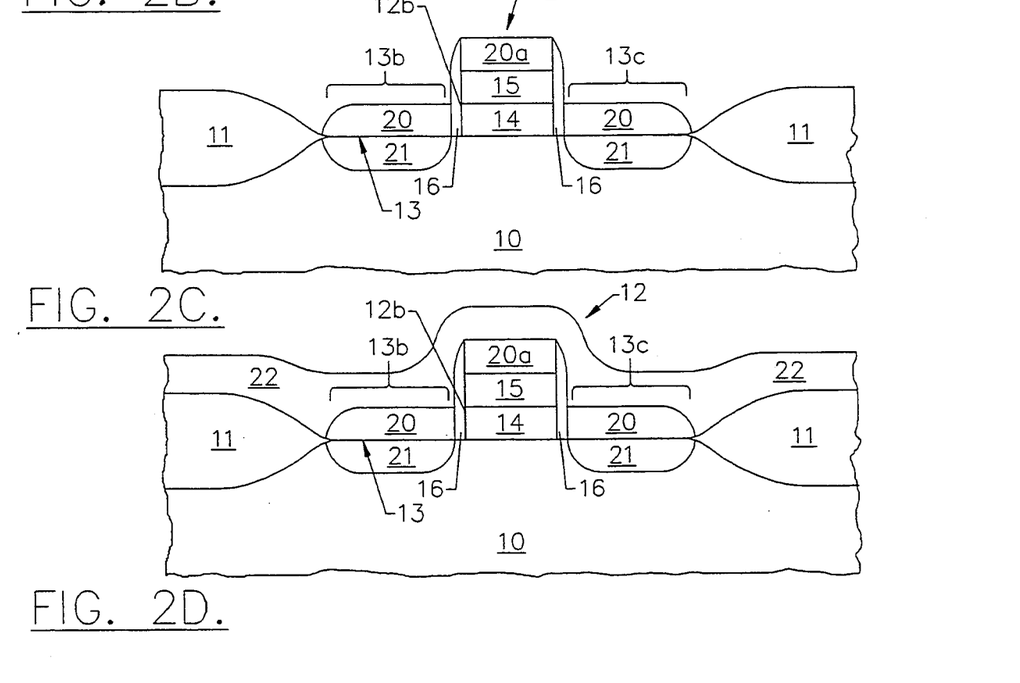

Referring now to FIG. 2C, source and drain regions are formed as was already described in FIG. 1C. However, in the embodiment of FIG. 2C, the polysilicon gate conductor 15 is also doped by the dopant in the layer of germanosilicide alloy 20a on the top of gate electrode 12. This additional doping further lowers the resistivity of polysilicon gate conductor 15.

Figure 2E:
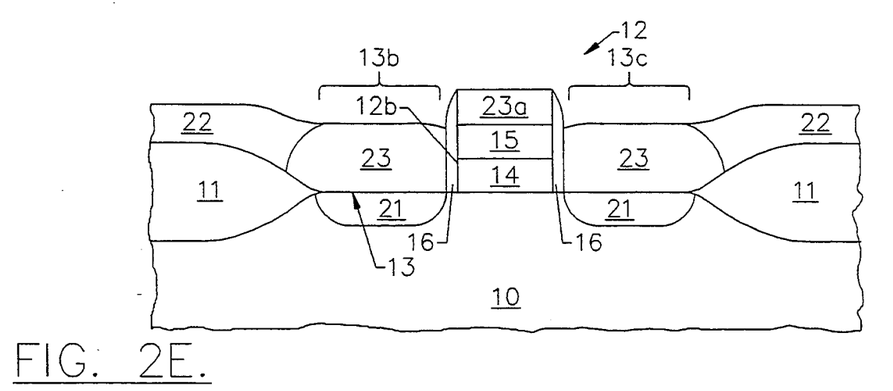

Then, as shown in FIG. 2D, a layer of metal 22 is blanket deposited, as was described in connection with FIG. 1D. As shown in FIG. 2E the germanosilicide layer is formed, as was described in connection with FIG. 1E. However, in contrast with FIG. 1E, a layer of germanosilicide 23a is formed on top 12a of gate electrode 12, in addition to the formation of layer 23 over source and drain regions 21.

Figure 2F:
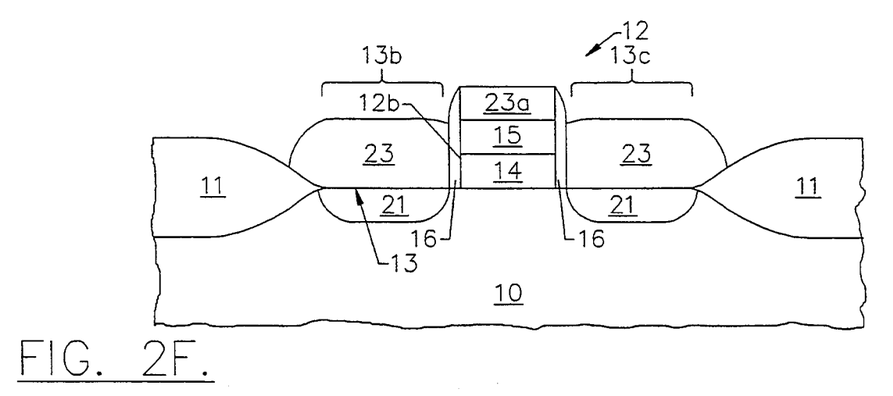

Finally, as shown in FIG. 2F, the unreacted metal layer 22 is removed, as was described in connection with FIG. 1F. Accordingly, a self-aligned germanosilicide gate contact 23a may also be formed, in addition to the self-aligned source and drain contacts 23, while also providing additional doping in polysilicon gate conductor 15 to lower the resistivity thereof. Shallow junctions with self-aligned high performance contacts are thereby provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor structure comprising:
   a semiconductor substrate having a face; and
   a layer of silicon-germanium alloy on said face, wherein said layer of silicon-germanium alloy is doped with a predetermined dopant; and
   wherein said semiconductor substrate is doped with said predetermined dopant at said face, beneath said layer of silicon-germanium alloy.

2. The semiconductor structure of claim 1 wherein said layer of silicon-germanium alloy comprises a layer of germanosilicide alloy.

3. A semiconductor structure comprising:
   a semiconductor substrate having a face;
   a pair of laterally spaced apart regions in said semiconductor substrate, at said face, wherein said laterally spaced apart regions are doped with a predetermined dopant;
   an electrode on said first face, between said pair of laterally spaced apart regions; and
   a layer of silicon-germanium alloy on said face, over said pair of laterally spaced apart regions, wherein said layer of silicon-germanium alloy is doped with said predetermined dopant.

4. The semiconductor structure of claim 3 wherein said layer of silicon-germanium alloy comprises a layer of germanosilicide alloy.

5. The semiconductor device of claim 3 wherein said pair of laterally spaced apart regions are field effect transistor source and drain regions and wherein said electrode comprises a field effect transistor gate electrode.

6. The semiconductor structure of claim 5 wherein said electrode includes a top; said semiconductor device further comprising a layer of silicon-germanium alloy on said top.

7. The semiconductor structure of claim 6 wherein said layer of silicon-germanium alloy on said top comprises a layer of germanosilicide alloy on said top.

8. A field effect transistor comprising:
   a semiconductor substrate having a face;
   laterally spaced apart source and drain regions in said semiconductor substrate, at said face, wherein said laterally spaced apart source and drain regions are doped with a predetermined dopant;
   a gate electrode on said face, between said source and drain regions, said gate electrode comprising a gate insulating layer on said face and a gate conductor on said gate insulating layer, opposite said face; and
   a layer of silicon-germanium alloy on said face, over said source and drain regions, wherein said layer of silicon-germanium alloy is doped with said predetermined dopant.

9. The field effect transistor of claim 8 wherein said layer of silicon-germanium alloy comprises a layer of germanosilicide alloy.

10. The field effect transistor of claim 8 wherein said gate insulating layer comprises a layer of silicon dioxide and wherein said gate conductor comprises polycrystalline silicon.

11. The field effect transistor of claim 8 further comprising a layer of silicon-germanium alloy on said gate conductor, opposite said gate insulating layer.

12. The field effect transistor of claim 8 further comprising a layer of germanosilicide alloy on said gate conductor, opposite said gate insulating layer.

* * * * *

UNITED STATES PATENT AND TRADEMARK OFFICE
CERTIFICATE OF CORRECTION

PATENT NO. : 5,336,903
DATED : August 9, 1994
INVENTOR(S) : Ozturk et al.

It is certified that error appears in the above-identified patent and that said Letters Patent is hereby corrected as shown below:

On the title page:

UNDER "REFERENCES CITED":

Please add -- 5,126,805   6/1992   Bulat et al. --.

UNDER "OTHER PUBLICATIONS":

Publication No. 1, "Sangameria" should be -- Sanganeria --.

IN THE SPECIFICATION:

Column 4, line 15, "Angsttoms" should be -- Angstroms --.

Column 5, line 18, after "FIG. 1A" description add the following:

FIGS. 1B-1F illustrate cross-sectional views of a structure according to the present invention during intermediate fabrication steps.

FIGS. 2A-2F illustrate a second embodiment of a structure according to the present invention during intermediate fabrication steps.

UNITED STATES PATENT AND TRADEMARK OFFICE
CERTIFICATE OF CORRECTION

PATENT NO. : 5,336,903
DATED : August 9, 1994
INVENTOR(S) : Mehmet C. Ozturk, et al.

It is certified that error appears in the above-indentified patent and that said Letters Patent is hereby corrected as shown below:

FIGS. 3A-3C graphically illustrate boron concentration versus depth for different diffusion times and temperatures according to the present invention.

Signed and Sealed this

First Day of November, 1994

*Attest:*

BRUCE LEHMAN

*Attesting Officer*   *Commissioner of Patents and Trademarks*